US009891443B2

(12) United States Patent
Hamada et al.

(10) Patent No.: US 9,891,443 B2
(45) Date of Patent: Feb. 13, 2018

(54) OPTICAL DEVICE

(71) Applicant: NIDEC SANKYO CORPORATION, Suwa-gun, Nagano (JP)

(72) Inventors: Yoshihiro Hamada, Nagano (JP); Shinroku Asakawa, Nagano (JP); Tatsuki Wade, Nagano (JP); Shinji Minamisawa, Nagano (JP)

(73) Assignee: NIDEC SANKYO CORPORATION, Suwa-gun, Nagano (JP)

( * ) Notice: Subject to any disclaimer, the term of this patent is extended or adjusted under 35 U.S.C. 154(b) by 103 days.

(21) Appl. No.: 14/651,467

(22) PCT Filed: Dec. 10, 2013

(86) PCT No.: PCT/JP2013/083054
§ 371 (c)(1),
(2) Date: Jun. 11, 2015

(87) PCT Pub. No.: WO2014/092070
PCT Pub. Date: Jun. 19, 2014

(65) Prior Publication Data
US 2015/0370086 A1    Dec. 24, 2015

(30) Foreign Application Priority Data

Dec. 11, 2012 (JP) ................. 2012-269974

(51) Int. Cl.
*G02B 27/64*  (2006.01)
*G03B 3/10*  (2006.01)
(Continued)

(52) U.S. Cl.
CPC ............. *G02B 27/646* (2013.01); *G02B 7/09* (2013.01); *G03B 5/00* (2013.01); *H04N 5/2253* (2013.01);
(Continued)

(58) Field of Classification Search
CPC .......... G02B 27/646; G02B 7/09; G03B 5/00; G03B 3/10; G03B 2205/0007;
(Continued)

(56) References Cited

U.S. PATENT DOCUMENTS

2011/0097062 A1* 4/2011 Tsuruta ................. G02B 7/022
396/55
2012/0314308 A1* 12/2012 Ikushima ................ G02B 7/08
359/814
2013/0119785 A1* 5/2013 Han ..................... H02K 41/035
310/12.16

FOREIGN PATENT DOCUMENTS

JP    2011257555 A    12/2011

OTHER PUBLICATIONS

International Search Report for corresponding Application No. PCT/JP2013/083054; dated Mar. 11, 2014, with English translation.

* cited by examiner

*Primary Examiner* — Marin Pichler
(74) *Attorney, Agent, or Firm* — Cantor Colburn LLP

(57) ABSTRACT

An optical device may include a movable part including a lens; a holding part to hold the movable part; and a drive mechanism to drive the movable part. The holding part may include a case body. The drive mechanism may include a plurality of drive magnets; a plurality of sheet-shaped coils including a coil part; and a flexible printed circuit board including a coil attaching part. A plurality of the sheet-shaped coils may be attached to one face of the coil attaching part. A thickness of the coil attaching part is thinner than the sheet-shaped coil. A width of the coil attaching part may be narrower than a width of the sheet-shaped coil.

7 Claims, 7 Drawing Sheets

(51) Int. Cl.
    *G02B 7/09*          (2006.01)
    *G03B 5/00*          (2006.01)
    *H04N 5/225*        (2006.01)

(52) U.S. Cl.
    CPC ............ *H04N 5/2254* (2013.01); *G03B 3/10* (2013.01); *G03B 2205/0007* (2013.01); *G03B 2205/0069* (2013.01)

(58) Field of Classification Search
    CPC ......... G03B 2205/0069; H04N 5/2253; H04N 5/2254; H04N 5/2328; H04N 5/23287
    USPC .......... 359/554, 557, 814, 824, 133, 208.11; 310/12.16; 396/55, 133; 348/208.4–208.7, 208.11
    See application file for complete search history.

OPTICAL DEVICE

CROSS REFERENCE TO RELATED APPLICATIONS

This is the U.S. national stage of application No. PCT/JP2013/083054, filed on Dec. 10, 2013. Priority under 35 U.S.C. § 119(a) and 35 U.S.C. § 365(B) is claimed from Japanese Application No. 2012-269974, filed Dec. 11, 2012, the disclosures of which are incorporated herein by reference.

FIELD OF THE INVENTION

The present invention relates to a small optical device which is mounted on a cell phone or the like.

BACKGROUND

Conventionally, an optical unit has been known which is provided with a shake correction function by which a movable module mounted with a lens and an imaging element is swung to correct a shake (see, for example, Patent Literature 1). An optical unit described in Patent Literature 1 includes a fixed body swingably holding a movable module and a shake correction drive mechanism structured to swing the movable module with respect to the fixed body. The shake correction drive mechanism in the optical unit includes four permanent magnets which are formed in a substantially quadrangular plate shape and are fixed to an outer peripheral face of the movable module and a sheet-shaped coil which is formed in a band shape and is integrally provided with four coil parts facing the four permanent magnets respectively. The fixed body is provided with an upper cover in a substantially rectangular tube shape which structures an outer peripheral face of the optical unit.

In the optical unit described in Patent Literature 1, the sheet-shaped coil formed in a band shape is fixed to an inner peripheral face of the upper cover so as to be along the inner peripheral face of the upper cover in a state that the sheet-shaped coil is bent at positions between the coil parts and is formed in a substantially rectangular tube shape. The sheet-shaped coil is fixed to the inner peripheral face of the upper cover by adhesion. In a case that the sheet-shaped coil is to be fixed to the upper cover, for example, in a state that an adhesive is applied to the inner peripheral face of the upper cover, the sheet-shaped coil bent in a substantially rectangular tube shape is inserted into an inner peripheral side with respect to the upper cover from one end side in an axial direction of the upper cover formed in a substantially rectangular tube shape and then the adhesive is cured.

CITATION LIST

Patent Literature

[PTL 1] Japanese Patent Laid-Open No. 2011-257555

In the optical unit described in Patent Literature 1, the coil parts are formed in the sheet-shaped coil and the thickness of the sheet-shaped coil is relatively large and thus rigidity of the sheet-shaped coil is relatively high. Therefore, in the optical unit, in a case that the sheet-shaped coil is to be fixed to the inner peripheral face of the upper cover, even when the sheet-shaped coil is bent in a substantially rectangular tube shape so as to be along the inner peripheral face of the upper cover, the shape of the sheet-shaped coil is not stable. Accordingly, in the optical unit, work for fixing the sheet-shaped coil to the upper cover is complicated. Further, in the optical unit, since the shape of the sheet-shaped coil is not stable, in a case that the sheet-shaped coil is to be attached to the upper cover, when the sheet-shaped coil bent in a substantially rectangular tube shape is inserted into an inner peripheral side with respect to the upper cover from one end side in the axial direction of the upper cover in a state that an adhesive is applied to an inner peripheral face of the upper cover, the adhesive having been applied to the inner peripheral face of the upper cover is scraped by the sheet-shaped coil and thus attaching strength of the sheet-shaped coil to the upper cover may be decreased.

SUMMARY

In view of the problem described above, at least an embodiment of the present invention provides an optical device including a movable part and a holding part movably holding the movable part and also including a sheet-shaped coil which is integrally provided with a coil part, the optical device being capable of easily performing attaching work of the sheet-shaped coil to the movable part or the holding part and capable of increasing attaching strength of the sheet-shaped coil to the movable part or the holding part.

To achieve the above, at least an embodiment of the present invention provides an optical device including a movable part having a lens for photographing, a holding part which movably holds the movable part, and a drive mechanism structured to drive the movable part. The holding part includes a case body which covers an outer peripheral side of the movable part The drive mechanism includes a plurality of drive magnets which are attached to one of an outer peripheral side of the movable part and an inner peripheral side of the case body, a plurality of sheet-shaped coils integrally having a coil part which are oppositely disposed to the drive magnets, and a flexible printed circuit board which is provided with a coil attaching part in a band shape to which a plurality of the sheet-shaped coils is attached, the flexible printed circuit board being attached to the other of the outer peripheral side of the movable part and the inner peripheral side of the case body. A plurality of the sheet-shaped coils is attached to one face of the coil attaching part with a predetermined gap space therebetween in a longitudinal direction of the coil attaching part formed in the band shape, a thickness of the coil attaching part is thinner than a thickness of the sheet-shaped coil, and a width of the coil attaching part in a short widthwise direction of the coil attaching part which is perpendicular to the longitudinal direction of the coil attaching part is narrower than a width of the sheet-shaped coil in the short widthwise direction of the coil attaching part. The other face of the coil attaching part is attached to the other of the outer peripheral side of the movable part and the inner peripheral side of the case body in a state that the coil attaching part is bent in a gap space portion between the sheet-shaped coils so as to be along the other of the outer peripheral side of the movable part and the inner peripheral side of the case body and the coil attaching part is formed in a substantially tube shape.

In the optical device in accordance with at least an embodiment of the present invention, in a state that the coil attaching part one face of which is attached with a plurality of the sheet-shaped coils is bent in a gap space portion between the sheet-shaped coils so as to be along the other of the outer peripheral side of the movable part and the inner peripheral side of the case body and the coil attaching part is formed in a substantially tube shape, the other face of the coil attaching part is attached to the other of the outer peripheral side of the movable part and the inner peripheral side of the case body. Further, in at least an embodiment of the present invention, the thickness of the coil attaching part is thinner than the thickness of the sheet-shaped coil. In other words, in at least an embodiment of the present invention, the coil attaching part is bent in a portion which is thinner than the sheet-shaped coil. Therefore, in at least an embodiment of the present invention, a shape of the coil attaching part which is bent in a gap space portion between the sheet-shaped coils and is formed in a substantially tube shape is easily stabilized and thus the coil attaching part formed in a substantially tube shape is easily handled. Accordingly, in at least an embodiment of the present invention, attaching work of the sheet-shaped coils to the case body which structures the holding part or to the movable part can be easily performed.

Further, in at least an embodiment of the present invention, a plurality of the sheet-shaped coils is attached to one face of the coil attaching part and the other face of the coil attaching part is attached to the other of the outer peripheral side of the movable part and the inner peripheral side of the case body and, in addition, the width of the coil attaching part in a short widthwise direction of the coil attaching part is narrower than the width of the sheet-shaped coil in the short widthwise direction of the coil attaching part. Therefore, according to at least an embodiment of the present invention, a gap space having a width of the thickness of the coil attaching part can be formed between the outer peripheral side of the movable part or the inner peripheral side of the case body and the sheet-shaped coil. Accordingly, in at least an embodiment of the present invention, for example, an adhesive for adhesively bonding the outer peripheral side of the movable part or the inner peripheral side of the case body and the sheet-shaped coil to each other can be retained in the gap space. In other words, according to at least an embodiment of the present invention, the gap space having a width of the thickness of the coil attaching part which is formed between the outer peripheral side of the movable part or the inner peripheral side of the case body and the sheet-shaped coil can be utilized as an adhesive reservoir. As a result, in at least an embodiment of the present invention, attaching strength of the sheet-shaped coil to the case body structuring the holding part or to the movable part can be increased.

In at least an embodiment of the present invention, for example, the drive mechanism includes four sheet-shaped coils, the case body includes a tube part which is formed in a substantially rectangular tube shape, the coil attaching part is fixed to the tube part, and the other face of the coil attaching part is attached to the inner peripheral face of the tube part in the state that the coil attaching part is bent in the gap space portion between the sheet-shaped coils so as to be along the inner peripheral face of the case body and the coil attaching part is formed in a substantially rectangular tube shape. In this case, attaching work of the sheet-shaped coil to the tube part of the case body can be performed easily. Further, in this case, a gap space having a width of the thickness of the coil attaching part can be formed between the inner peripheral face of the tube part of the case body and the sheet-shaped coil and the gap space is utilized as an adhesive reservoir for retaining an adhesive which is used to adhesively bond the sheet-shaped coil to the inner peripheral face of the tube part and thus attaching strength of the sheet-shaped coil to the inner peripheral face of the tube part can be increased.

In at least an embodiment of the present invention, it is preferable that the coil attaching part is formed with a protruded part which is protruded in the short widthwise direction of the coil attaching part so as to contact with a part of the sheet-shaped coil. According to this structure, inclination of the sheet-shaped coil (slanting of the sheet-shaped coil) with respect to the coil attaching part can be suppressed by the protruded part. Therefore, a gap space between the drive magnet and the coil part can be maintained appropriately. Further, inclination of the sheet-shaped coil with respect to the coil attaching part can be suppressed by the protruded part and thus a gap space having a width of the thickness of the coil attaching part can be formed appropriately between the outer peripheral side of the movable part or the inner peripheral side of the case body and the sheet-shaped coil.

In at least an embodiment of the present invention, it is preferable that the sheet-shaped coil is provided with two first solder lands for supplying electric power to the coil part and a second solder land which is disposed at a position displaced from the first solder lands at least in one of the longitudinal direction of the coil attaching part and the short widthwise direction of the coil attaching part, and the first solder lands and the second solder land are soldered and fixed to the coil attaching part. According to this structure, in addition to the two first solder lands for supplying electric power to the coil part, the second solder land is soldered and fixed to the coil attaching part and thus fixed strength of the sheet-shaped coil to the coil attaching part can be increased.

In at least an embodiment of the present invention, it is preferable that the coil attaching part is formed with a protruded part which is protruded in the short widthwise direction of the coil attaching part and is contacted with a part of the sheet-shaped coil, and the second solder land is soldered and fixed to the protruded part. According to this structure, inclination of the sheet-shaped coil with respect to the coil attaching part can be suppressed by the protruded part. Therefore, a gap space between the drive magnet and the coil part can be maintained appropriately. Further, inclination of the sheet-shaped coil with respect to the coil attaching part can be suppressed by the protruded part and thus a gap space having a width of the thickness of the coil attaching part can be formed appropriately between the outer peripheral side of the movable part or the inner peripheral side of the case body and the sheet-shaped coil. Further, according to this structure, the second solder land is soldered and fixed to the protruded part and thus an arrangement space of a solder land where the second solder land is soldered and fixed is easily secured in the coil attaching part.

In at least an embodiment of the present invention, it is preferable that the flexible printed circuit board is provided with an external connection part in a band shape for electrically connecting the coil part with the outside, and the external connection part is extended from a substantially center position in the longitudinal direction of the coil attaching part formed in the band shape in a state that the coil attaching part bent in the gap space portion between the sheet-shaped coils and formed in a substantially tube shape is developed. According to this structure, in a connected portion of the external connection part with the coil attaching part, a plurality of wiring patterns connected with a plurality of coil parts is diverged toward respective both end parts of the coil attaching part and the wiring patterns are extended toward the respective both end parts of the coil attaching part. Therefore, the number of wiring patterns arranged in the short widthwise direction of the coil attaching part can be reduced and, as a result, the width of the coil attaching part in the short widthwise direction can be made narrow.

In at least an embodiment of the present invention, it is preferable that the optical device includes a plate spring having a movable side fixed part which is fixed to the movable part, a holding side fixed part which is fixed to the holding part, and a spring part which connects the movable side fixed part with the holding side fixed part and, when one side in an optical axis direction of the lens is an object side and the other side in the optical axis direction of the lens is an anti-object side, the holding side fixed part is welded and fixed to the holding part on the anti-object side with respect to the sheet-shaped coil, and the sheet-shaped coil is formed with a protruded part which protrudes toward the anti-object side. According to this structure, a distance between a welded portion of the holding side fixed part to the holding part and a main body portion of the sheet-shaped coil can be secured by utilizing the protruded part. Therefore, when the holding side fixed part is to be welded to the holding part, even in a case that sparks are scattered toward a main body portion of the sheet-shaped coil, the main body portion of the sheet-shaped coil is prevented from being damaged. Further, a short circuit can be prevented from being formed between the soldered portion of the sheet-shaped coil to the coil attaching part and the welded portion of the holding side fixed part to the holding part.

In at least an embodiment of the present invention, it is preferable that the sheet-shaped coil is formed with a coil side recessed part which is recessed in the short widthwise direction of the coil attaching part, and the coil attaching part is formed with a circuit board side recessed part which is recessed in the short widthwise direction of the coil attaching part at a position corresponding to the coil side recessed part. According to this structure, aligning of the coil attaching part with the sheet-shaped coil can be performed easily by utilizing the coil side recessed part and the circuit board side recessed part.

In at least an embodiment of the present invention, for example, the coil attaching part is formed with a through-hole for positioning the coil attaching part with respect to a jig to which the coil attaching part is fixed when the sheet-shaped coil is to be attached to the coil attaching part. In this case, the coil attaching part is positioned to the jig by utilizing the through-hole.

As described above, according to at least an embodiment of the present invention, in an optical device including a movable part and a holding part movably holding the movable part, and also including a sheet-shaped coil which is integrally provided with a coil part, attaching work of the sheet-shaped coil to the movable part or the holding part can be easily performed and attaching strength of the sheet-shaped coil to the movable part or the holding part can be increased.

BRIEF DESCRIPTION OF DRAWINGS

Embodiments will now be described, by way of example only, with reference to the accompanying drawings which are meant to be exemplary, not limiting, and wherein like elements are numbered alike in several Figures, in which.

DESCRIPTION OF EMBODIMENTS

An embodiment of the present invention will be described below with reference to the accompanying drawings.
(Entire Structure of Optical Device)

Figure 1:
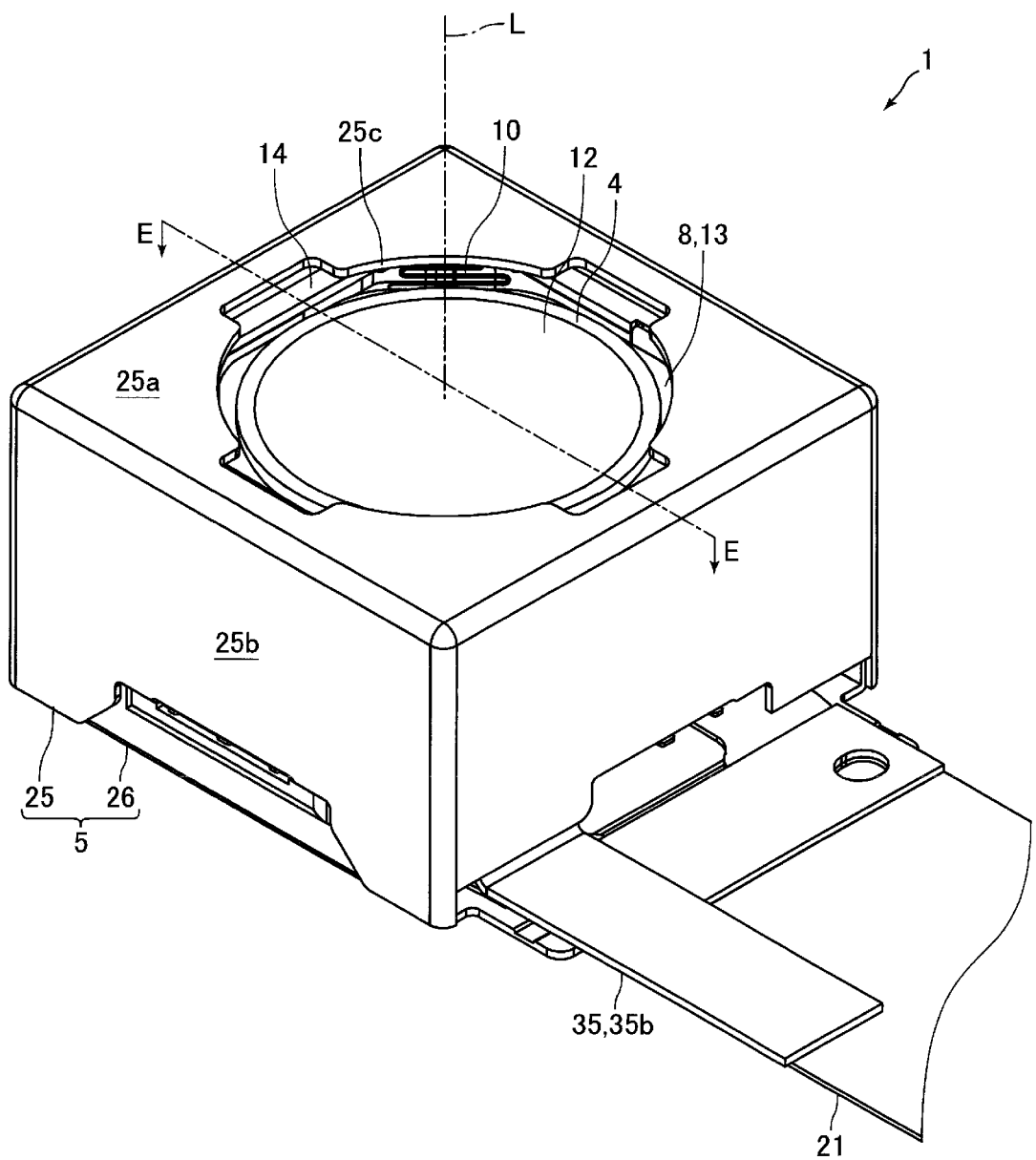
FIG. 1 is a perspective view showing an optical device in accordance with an embodiment of the present invention.
Figure 1:
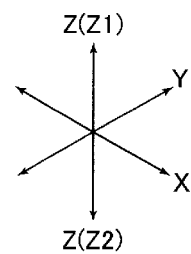
Figure 2:
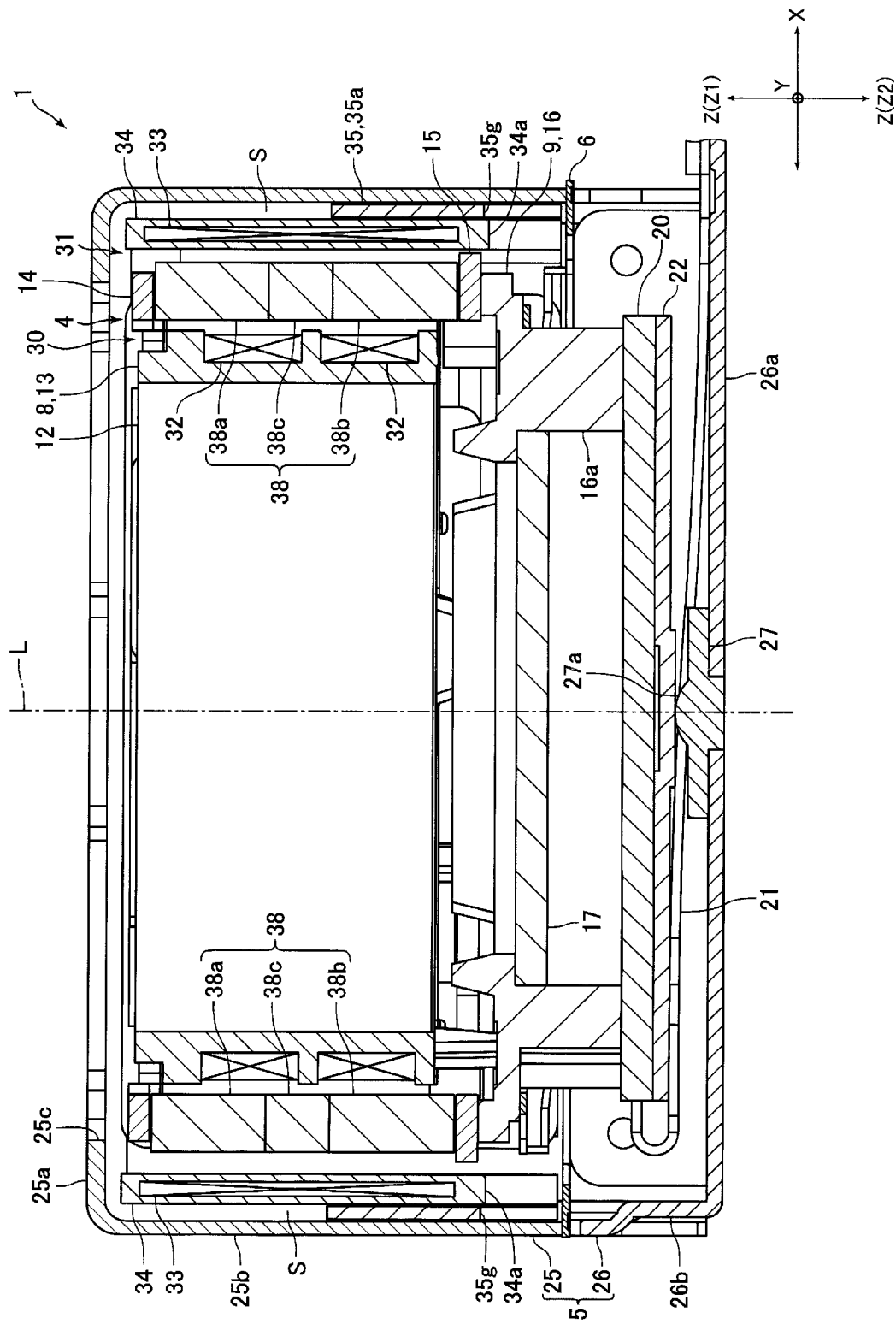
FIG. 2 is a cross-sectional view showing the "E-E" cross section in FIG. 1.
Figure 3:
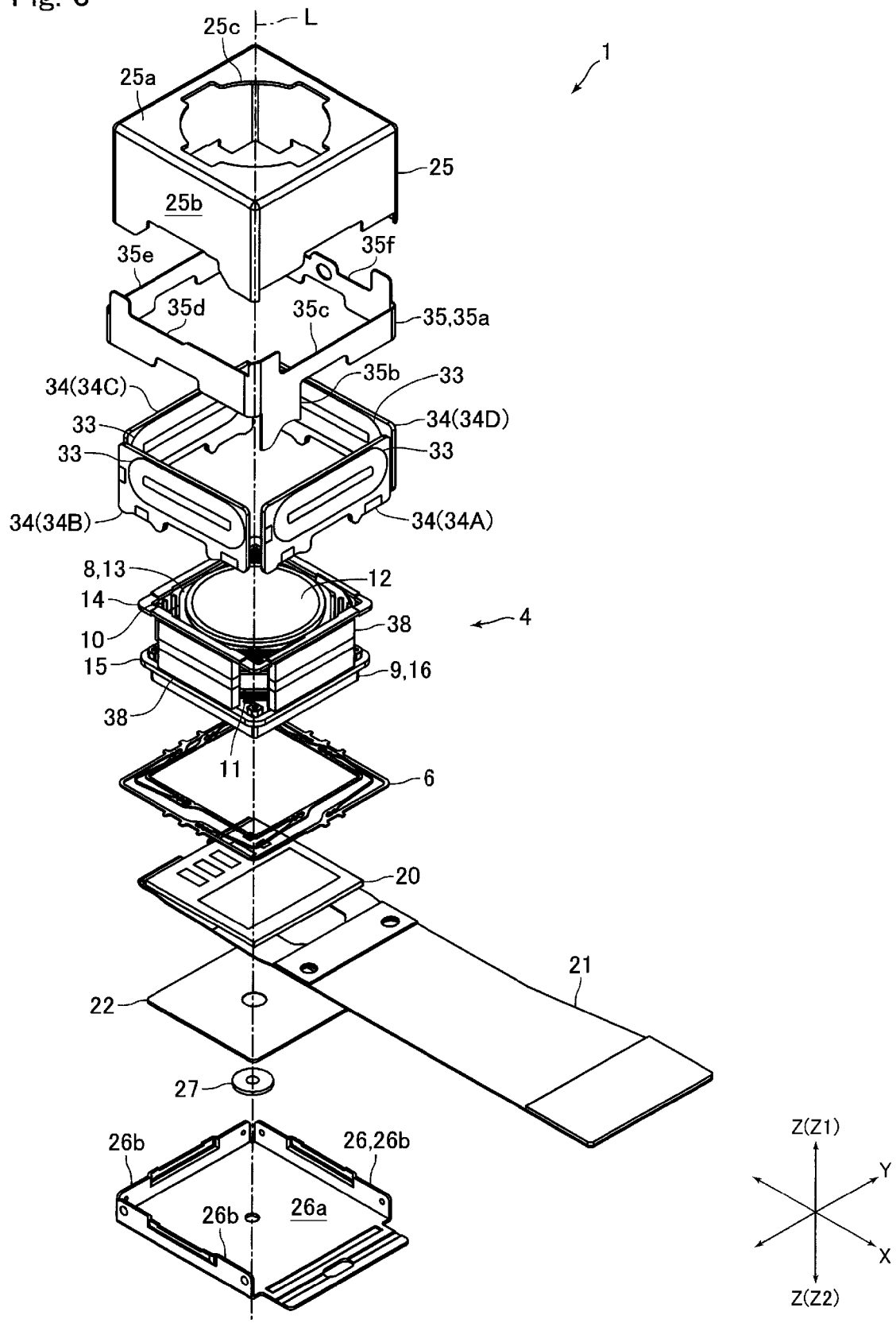
FIG. 3 is an exploded perspective view showing the optical device in FIG. 1.

FIG. 1 is a perspective view showing an optical device 1 in accordance with an embodiment of the present invention. FIG. 2 is a cross-sectional view showing the "E-E" cross section in FIG. 1. FIG. 3 is an exploded perspective view showing the optical device 1 in FIG. 1. In the following description, as shown in FIG. 1, three directions perpendicular to each other are respectively set in an "X" direction, a "Y" direction and a "Z" direction, and the "X" direction is a right and left direction, the "Y" direction is a front and rear direction, and the "Z" direction is an upper and lower direction. Further, a "Z1" direction side in FIG. 1 is an "upper" side and a "Z2" direction side is a "lower" side.

An optical device 1 in this embodiment is a small and thin camera which is mounted on a portable apparatus such as a cell phone, a drive recorder, a monitoring camera system or the like. The optical device 1 is provided with an autofocus function and a shake correction function. The optical device 1 is formed in a substantially quadrangular prism shape as a whole. In this embodiment, the optical device 1 is formed so that its shape when viewed in a direction of an optical axis "L" (optical axis direction) of a lens for photographing is a substantially square shape. Four side faces of the optical device 1 are substantially parallel to a plane formed by the right and left direction and the upper and lower direction (in other words, the "Z-X" plane formed by the "Z" direction and the "X" direction) or a plane formed by the front and rear direction and the upper and lower direction (in other words, the "YZ" plane formed by the "Y" direction and the "Z" direction).

The optical device 1 includes a movable module 4 as a movable part having a lens for photographing and an imaging element, and a support body 5 as a holding part which swingably holds the movable module 4. The movable module 4 is connected with the support body 5 through a plate spring 6. In this embodiment, the upper and lower direction is substantially coincided with the optical axis direction of the movable module 4 when the movable module 4 is not swung. Further, in this embodiment, an imaging element is mounted on a lower end side of the movable module 4 and an object to be photographed disposed on an upper side is photographed. In other words, in this embodiment, an upper side ("Z1" direction side) is an object to be photographed side (object side) which is one side in the optical axis direction and a lower side ("Z2" direction side) is an anti-object side (imaging element side, image side) which is the other side in the optical axis direction.

The movable module 4 is formed in a substantially quadrangular prism shape as a whole. In this embodiment, the movable module 4 is formed so that its shape when viewed in the optical axis direction is a substantially square shape. The movable module 4 includes a movable body 8 which holds a lens and is movable in the optical axis direction, and a holding body 9 which movably holds the movable body 8 in the optical axis direction. The movable body 8 is movably held by the holding body 9 through a plate spring 10 connecting the movable body 8 with the holding body 9 on an upper end side of the movable body 8 and a plate spring 11 connecting the movable body 8 with the holding body 9 on a lower end side of the movable body 8.

The movable body 8 includes a lens holder 12 to which a plurality of lenses is fixed and a sleeve 13 which holds the lens holder 12. The holding body 9 includes a magnet fixing member 14 to which upper end faces of drive magnets 38 described below are fixed, a magnet fixing member 15 to which lower end faces of the drive magnets 38 are fixed, and a base member 16 which structures a lower end side portion of the movable module 4.

The lens holder 12 is formed in a substantially cylindrical tube shape. A plurality of lenses is fixed to an inner peripheral side of the lens holder 12. The sleeve 13 is formed in a substantially tube shape. Specifically, the sleeve 13 is formed in a substantially tube shape whose inner periphery of the sleeve 13 when viewed in the optical axis direction is a circular shape and its outer periphery of the sleeve 13 when viewed in the optical axis direction is a substantially regular octagonal shape. The sleeve 13 holds the lens holder 12 on its inner peripheral side. In other words, an outer peripheral face of the lens holder 12 is fixed to an inner peripheral face of the sleeve 13. In this embodiment, an outer peripheral face of the sleeve 13 is an outer peripheral face of the movable body 8 and the outer peripheral face of the movable body 8 is formed so that its shape when viewed in the optical axis direction is a substantially regular octagonal shape.

The magnet fixing member 14 and 15 are formed in a frame shape. Specifically, the magnet fixing members 14 and 15 are formed so that their shapes when viewed in the optical axis direction are substantially square frame shapes. The movable body 8 is disposed on inner peripheral sides of the magnet fixing members 14 and 15 which are formed in frame shapes. The base member 16 is formed in a flat and substantially rectangular solid shape. A center of the base member 16 is formed with a through-hole 16a and the base member 16 is formed so that its shape when viewed in the optical axis direction is a substantially square frame shape. An under face of the magnet fixing member 15 is fixed to an upper end face of the base member 16. An IR cut filter 17 is fixed to the through-hole 16a.

The plate spring 10 is provided with a movable body fixed part which is fixed to an upper end side of the sleeve 13, a holding body fixed part which is fixed to the magnet fixing member 14, and spring parts connecting the movable body fixed part with the holding body fixed part. The plate spring 10 is fixed to the sleeve 13 and the magnet fixing member 14 so that its thickness direction is substantially coincided with the upper and lower direction. The plate spring 11 is provided with a movable body fixed part which is fixed to a lower end side of the sleeve 13, a holding body fixed part which is fixed to the magnet fixing member 15, and spring parts connecting the movable body fixed part with the holding body fixed part. The plate spring 11 is fixed to the sleeve 13 and the magnet fixing member 15 so that its thickness direction is substantially coincided with the upper and lower direction.

The imaging element is mounted on a circuit board 20. The circuit board 20 is fixed to an under face of the base member 16. A flexible printed circuit board (FPC) 21 is connected with the circuit board 20. The FPC 21 is led around on a lower end side of the optical device 1 and is extended out from a side face of the optical device 1. An abutting plate 22 with which a support point member 27 is abutted is fixed to an under face of the circuit board 20.

The support body 5 includes a case body 25 which structures four side faces of the support body 5 in the front and rear direction and the right and left direction, and a lower case body 26 which structures a lower end side portion of the support body 5. In this embodiment, the case body 25 structures four side faces of the optical device 1 in the front and rear direction and the right and left direction and the lower case body 26 structures a lower end side portion of the optical device 1.

The case body 25 is, for example, formed of nonmagnetic metal material. Further, the case body 25 is formed in a substantially bottomed square tube shape having a bottom part 25a formed in a substantially quadrangular flat plate shape and a tube part 25b formed in a substantially rectangular tube shape. The bottom part 25a in this embodiment is formed in a substantially square flat plate shape. Further, the bottom part 25a is connected with an upper end of the tube part 25b to structure an upper end face of the case body 25. The bottom part 25a is formed with a through-hole 25c penetrating in the upper and lower direction. The through-hole 25c is formed so that its center and the optical axis "L" are substantially coincided with each other. The case body 25 is disposed so that its axial direction and the upper and lower direction are substantially coincided with each other. Further, the case body 25 is disposed so as to cover the movable module 4, a lens drive mechanism 30 and a shake correction mechanism 31 described below from an outer peripheral side.

The lower case body 26 is, as shown in FIG. 3, structured of a bottom part 26a which is formed in a substantially square flat plate shape and three side face parts 26b which are respectively stood up toward an upper side from three sides of the bottom part 26a. The bottom part 26a of the lower case body 26 structures an under face of the optical device 1. A support point member 27 is fixed to the center of the bottom part 26a. The support point member 27 is formed so that a supporting point part 27a which serves as a supporting point for swinging the movable module 4 is protruded to an upper side. A surface of the supporting point part 27a is formed in a curved face shape in which a part of a spherical surface is cut off. The supporting point part 27a is abutted with the abutting plate 22.

The plate spring 6 is provided with a movable side fixed part which is fixed to the movable module 4, a holding side fixed part which is fixed to the support body 5, and four spring parts which connect the movable side fixed part with the holding side fixed part. The movable side fixed part is fixed to a lower end side of the movable module 4 and the holding side fixed part is fixed to an upper end of the side face part 26b of the lower case body 26 and thus the plate spring 6 connects the movable module 4 with the support body 5 on the lower end side (in other words, on the anti-object side).

In this embodiment, the spring parts are resiliently bent with respect to the holding side fixed part and thereby the movable module 4 fixed to the movable side fixed part is capable of swinging. The plate spring 6 is fixed in a resiliently bent state so that pressurization is generated for surely abutting the supporting point part 27a with the abutting plate 22 (in other words, for generating an urging force which urges the movable module 4 to a lower direction). Further, in this embodiment, the holding side fixed part is fixed to an upper end of the side face part 26b by welding. The holding side fixed part is fixed to the upper end of the side face part 26b on a lower side with respect to a sheet-shaped coil 34 described below.

The optical device 1 includes a lens drive mechanism 30 for driving the movable body 8 in the optical axis direction with respect to the holding body 9, and a shake correction mechanism 31 structured to swing the movable module 4 with respect to the support body 5 for correcting a shake such as a shake of hand. Structures of the lens drive mechanism 30 and the shake correction mechanism 31 will be described below.

(Structures of Lens Drive Mechanism and Shake Correction Mechanism)

Two lens drive coils 32 which structure the lens drive mechanism 30 are attached to an outer peripheral face of the sleeve 13. The lens drive coil 32 is wound around along the outer peripheral face of the sleeve 13. Two lens drive coils 32 are wound so that their winding directions are different from each other. Further, two lens drive coils 32 are fixed to the outer peripheral face of the sleeve 13 with a predetermined space therebetween in the upper and lower direction.

A sheet-shaped coil 34 integrally provided with a coil part 33 and structuring the shake correction mechanism 31 is disposed on respective inner sides of four side faces which structure the tube part 25b of the case body 25. In other words, the shake correction mechanism 31 includes four sheet-shaped coils 34. The sheet-shaped coil 34 is an FP coil which is structured so that the coil part 33 comprised of a minute copper wiring line is formed on a printed circuit board. The coil part 33 is formed in a substantially rectangular frame shape and its long side portions are disposed so as to overlap in the upper and lower direction with each other. A surface of the coil part 33 is covered with an insulation film. A specific structure of the sheet-shaped coil 34 will be described below.

Four sheet-shaped coils 34 are electrically connected and fixed to a relay flexible printed circuit board (FPC) 35. The FPC 35 is provided with a coil attaching part 35a in a band shape to which four sheet-shaped coils 34 are attached, and an external connection part 35b in a band shape for electrically connecting the coil parts 33 with the outside. The coil attaching part 35a is disposed on an inner peripheral side with respect to the tube part 25b in a bent state in a substantially rectangular tube shape. Four sheet-shaped coils 34 are attached to an inner peripheral face of the coil attaching part 35a which is bent in a substantially rectangular tube shape and an outer peripheral face of the coil attaching part 35a is attached to the inner peripheral face of the tube part 25b. In other words, four sheet-shaped coils 34 are fixed to the inner peripheral face of the tube part 25b through the coil attaching part 35a. The external connection part 35b is connected with the FPC 21. A specific structure of the FPC 35 will be described below.

The drive magnet 38 formed in a substantially rectangular flat plate shape is fixed to each of four straight portions of the magnet fixing member 14 and each of four straight portions of the magnet fixing member 15 which are formed in a substantially square frame shape. In other words, four drive magnets 38 are attached on an outer peripheral side of the movable module 4. In four drive magnets 38 which are fixed to the magnet fixing members 14 and 15, two drive magnets 38 disposed parallel to each other are disposed so as to be substantially parallel to the "Z-X" plane, and two remaining drive magnets 38 disposed parallel to each other are disposed so as to be substantially parallel to the "YZ" plane.

The drive magnet 38 is structured of two magnet pieces, i.e., a first magnet piece 38a and a second magnet piece 38b which are formed in a substantially rectangular flat plate shape, and a magnetic member 38c which is disposed between the first magnet piece 38a and the second magnet piece 38b. Specifically, the first magnet piece 38a, the second magnet piece 38b and the magnetic member 38c are adhesively bonded and fixed to each other in a state that the magnetic member 38c is sandwiched between an under face of the first magnet piece 38a and an upper face of the second magnet piece 38b and thereby the drive magnet 38 is formed.

The drive magnet 38 is magnetized so that a magnetic pole formed on one side face and a magnetic pole formed on the other side face are different from each other. In other words, the drive magnet 38 disposed substantially parallel to the "Z-X" plane is magnetized so that a magnetic pole formed on a front face of the drive magnet 38 and a magnetic pole formed on its rear face are different from each other. Further, the drive magnet 38 disposed substantially parallel to the "YZ" plane is magnetized so that a magnetic pole formed on a right side face of the drive magnet 38 and a magnetic pole formed on its left side face are different from each other.

Further, the drive magnet 38 is magnetized so that two magnetic poles different from each other are overlapped with each other in the upper and lower direction on its side face. Specifically, the drive magnet 38 is magnetized so that, in the front and rear direction or the right and left direction, a magnetic pole formed on an outer side face of the first magnet piece 38a and a magnetic pole formed on an outer side face of the second magnet piece 38b are different from each other (in other words, in the front and rear direction or the right and left direction, a magnetic pole formed on an inner side face of the first magnet piece 38a and a magnetic pole formed on an inner side face of the second magnet piece 38b are different from each other).

In this embodiment, four drive magnets 38 are disposed so that magnetic poles of inner side faces of four first magnet pieces 38a are the same magnetic pole as each other (in other words, so that all magnetic poles of inner side faces of four second magnet pieces 38b are the same magnetic pole as each other). In other words, in this embodiment, four drive magnets 38 are disposed so that all magnetic poles of outer side faces of four first magnet pieces 38a are the same as each other (in other words, all magnetic poles of outer side faces of four second magnet pieces 38b are the same as each other).

Inner side faces of the first magnet pieces 38a in the front and rear direction or the right and left direction face an outer peripheral face of one of two lens drive coils 32 through a predetermined gap space, and inner side faces of the second magnet pieces 38b in the front and rear direction or the right and left direction face an outer peripheral face of the other of the two lens drive coils 32 through a predetermined gap space. Further, outer side faces of the first magnet pieces 38a in the front and rear direction or the right and left direction face one of two long side portions of the coil parts 33 through a predetermined gap space and outer side faces of the second magnet pieces 38b in the front and rear direction or the right and left direction face the other of two long side portions of the coil parts 33 through a predetermined gap space.

In accordance with an embodiment of the present invention, the drive magnet 38 may be structured of one magnet piece. In a case that the drive magnet 38 is structured of one magnet piece, a portion corresponding to an arrangement portion of the magnetic member 38c in this embodiment is formed as a non-magnetized region.

In this embodiment, the lens drive mechanism 30 is structured of the lens drive coils 32, the drive magnets 38 and the like and, when an electric current is supplied to the lens drive coils 32, a lens is moved in the optical axis direction together with the movable body 8. Further, in this embodiment, the shake correction mechanism 31 is structured of the coil parts 33, the drive magnets 38 and the like. When a variation of inclination of the optical device 1 is detected by a gyroscope disposed on an outer side of the optical device 1, an electric current is supplied to the coil parts 33 based on a detected result by the gyroscope. Further, when an electric current is supplied to the coil parts 33, the movable module 4 is swung with the supporting point part 27a as a center so as to incline the optical axis "L" and thereby a shake is corrected. The Shake correction mechanism 31 in this embodiment is a drive mechanism for driving the movable module 4 that is a movable part.

(Specific Structures of Sheet-Shaped Coil and Flexible Printed Circuit Board)

Figure 4:
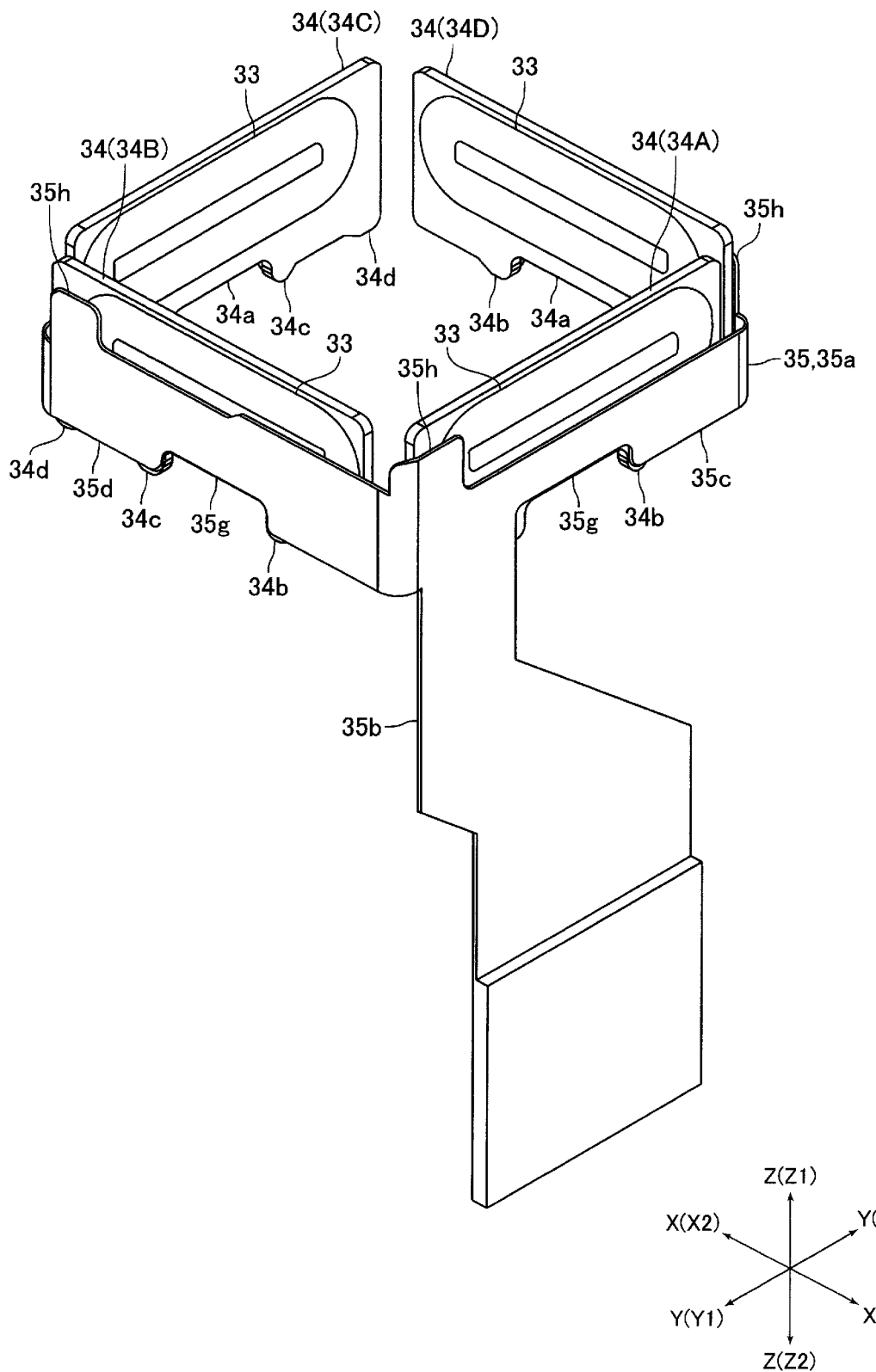
FIG. 4 is a perspective view showing a state that four sheet-shaped coils are fixed to a flexible printed circuit board shown in FIG. 3.
Figure 5:
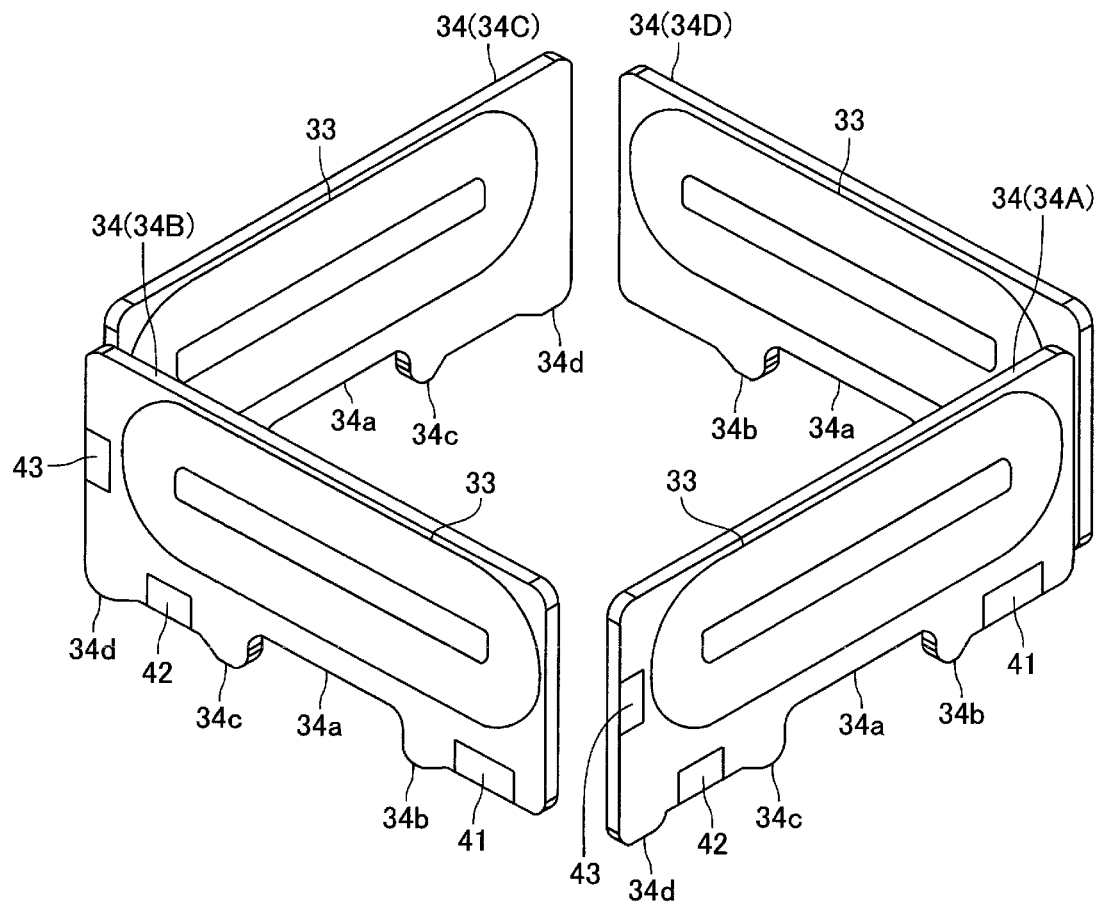
FIG. 5 is a perspective view showing sheet-shaped coils in FIG. 3.
Figure 5:
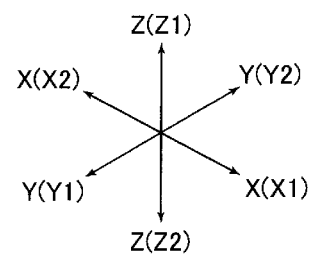
Figure 6:
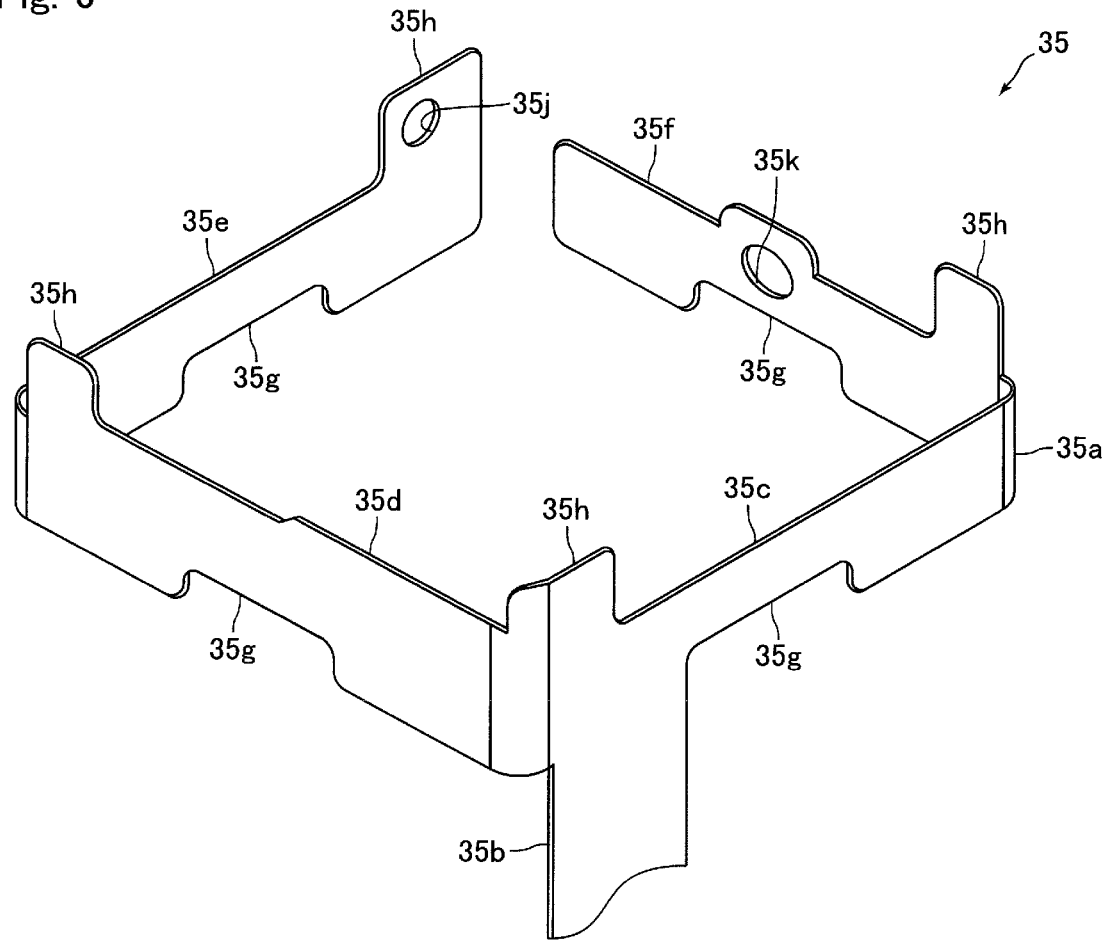
FIG. 6 is a perspective view showing a flexible printed circuit board in FIG. 3.
Figure 7:
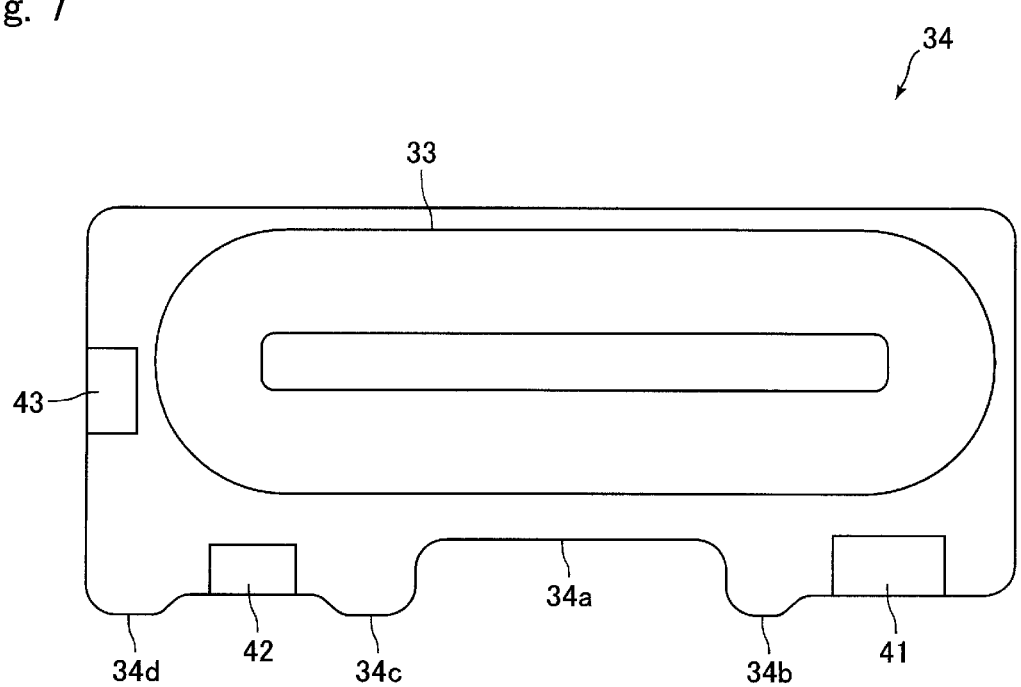
FIG. 7 is a front view showing a sheet-shaped coil in FIG. 5.

FIG. 4 is a perspective view showing a state that four sheet-shaped coils 34 are fixed to the flexible printed circuit board 35 shown in FIG. 3. FIG. 5 is a perspective view showing the sheet-shaped coils 34 in FIG. 3. FIG. 6 is a perspective view showing the flexible printed circuit board 35 in FIG. 3. FIG. 7 is a front view showing the sheet-shaped coil 34 in FIG. 5. In the following descriptions, the "X1" direction side in FIG. 4 and the like is referred to as a "right" side, the "X2" direction side is referred to as a "left" side, the "Y1" direction side is a "front" side, and the "Y2" direction side is a "rear" (back) side.

The sheet-shaped coil 34 is formed in a substantially rectangular thin flat plate shape. Two of four sheet-shaped coils 34 disposed parallel to each other are disposed substantially parallel to the "Z-X" plane and two remaining sheet-shaped coils 34 disposed parallel to each other are disposed substantially parallel to the "YZ" plane. Further, the sheet-shaped coil 34 is disposed so that a longitudinal direction of the sheet-shaped coil 34 formed in a substantially rectangular shape is coincided with the front and rear direction or the right and left direction and its short widthwise direction is coincided with the upper and lower direction.

In the following descriptions, in a case that four sheet-shaped coils 34 are distinguishably expressed, the sheet-shaped coil 34 disposed on the right side is indicated as a "sheet-shaped coil 34A", the sheet-shaped coil 34 disposed on a front side is indicated as a "sheet-shaped coil 34B", the sheet-shaped coil 34 disposed on a left side is as a "sheet-shaped coil 34C", and the sheet-shaped coil 34 disposed on a rear side is as a "sheet-shaped coil 34D".

A recessed part 34a as a coil side recessed part is formed on a lower end side of the sheet-shaped coil 34. The recessed part 34a is formed so as to recess to an upper side and is formed in a substantially rectangular shape. In the sheet-shaped coils 34A and 34C, the recessed part 34a is formed at a substantially center position in the front and rear direction and in a predetermined range in the front and rear direction. In the sheet-shaped coils 34B and 34D, the recessed part 34a is formed at a substantially center position in the right and left direction and in a predetermined range in the right and left direction.

Three protruded parts 34b through 34d slightly protruding toward a lower side (anti-object side) are formed on a lower end side of the sheet-shaped coil 34. In the sheet-shaped coil 34A, the protruded part 34b is formed so as to be connected with a rear end of the recessed part 34a, the protruded part 34c is formed so as to be connected with a front end of the recessed part 34a, and the protruded part 34d is formed on a front end side of the sheet-shaped coil 34A. In the sheet-shaped coil 34B, the protruded part 34b is formed so as to be connected with a right end of the recessed part 34a, the protruded part 34c is formed so as to be connected with a left end of the recessed part 34a, and the protruded part 34d is formed on a left end side of the sheet-shaped coil 34B. In the sheet-shaped coil 34C, the protruded part 34b is formed so as to be connected with a front end of the recessed part 34a, the protruded part 34c is formed so as to be connected with a rear end of the recessed part 34a, and the protruded part 34d is formed on a rear end side of the sheet-shaped coil 34C. In the sheet-shaped coil 34D, the protruded part 34b is formed so as to be connected with a left end of the recessed part 34a, the protruded part 34c is formed so as to be connected with a right end of the recessed part 34a, and the protruded part 34d is formed on a right end side of the sheet-shaped coil 34D.

Total three solder lands, i.e., two solder lands 41 and 42 as a first solder land and one solder land 43 as a second solder land are formed in the sheet-shaped coil 34. The solder lands 41 through 43 are formed in a substantially rectangular shape. Further, the solder lands 41 through 43 are formed on an outer side face of the sheet-shaped coil 34 in the front and rear direction or the right and left direction. In other words, the solder lands 41 through 43 are formed on a right side face of the sheet-shaped coil 34A, a front face of the sheet-shaped coil 34B, a left side face of the sheet-shaped coil 34C, and a rear face of the sheet-shaped coil 34D. In addition, the solder lands 41 and 42 are formed on a lower end side of the sheet-shaped coil 34 and the solder land 43 is formed at a substantially center position in the upper and lower direction of the sheet-shaped coil 34.

The solder lands 41 and 42 are formed on outer sides with respect to the protruded parts 34b and 34c in the front and rear direction or the right and left direction. In other words, in the sheet-shaped coil 34A, the solder land 41 is formed on a rear side with respect to the protruded part 34b and the solder land 42 is formed between the protruded part 34c and the protruded part 34d. In the sheet-shaped coil 34B, the solder land 41 is formed on a right side with respect to the protruded part 34b and the solder land 42 is formed between the protruded part 34c and the protruded part 34d. In the sheet-shaped coil 34C, the solder land 41 is formed on a front side with respect to the protruded part 34b and the solder land 42 is formed between the protruded part 34c and the protruded part 34d. In the sheet-shaped coil 34D, the solder land 41 is formed on a left side of the protruded part 34b and the solder land 42 is formed between the protruded part 34c and the protruded part 34d.

The solder land 43 is formed at a position displaced from the solder lands 41 and 42 in the front and rear direction or the right and left direction. Specifically, in the sheet-shaped coil 34A, the solder land 43 is formed on a front end side of the sheet-shaped coil 34A and is disposed on a front side with respect to the solder land 42. In the sheet-shaped coil 34B, the solder land 43 is formed on a left end side of the sheet-shaped coil 34B and is disposed on a left side with respect to the solder land 42. In the sheet-shaped coil 34C, the solder land 43 is formed on a rear end side of the sheet-shaped coil 34C and is disposed on a rear side with respect to the solder land 42. In the sheet-shaped coil 34D, the solder land 43 is formed on a right end side of the sheet-shaped coil 34D and is disposed on a right side with respect to the solder land 42.

The solder lands 41 through 43 are soldered and fixed to solder lands (not shown) which are formed on the coil attaching part 35a. The solder lands 41 and 42 are used for supplying electric power to the coil part 33. The solder land 41 is electrically connected with one end of a copper wiring line structuring the coil part 33 and the solder land 42 is electrically connected with the other end of the copper wiring line structuring the coil part 33. The solder land 43 is used to increase a fixed strength of the sheet-shaped coil 34 to the coil attaching part 35a and thus the solder land 43 is not electrically connected with the coil part 33.

A thickness of the flexible printed circuit board (FPC) 35 is thinner than a thickness of the sheet-shaped coil 34. For example, the thickness of the FPC 35 is about one-fourth of the thickness of the sheet-shaped coil 34. The FPC 35 is, as described above, provided with the coil attaching part 35a and the external connection part 35b. The coil attaching part 35a is formed in a long and thin band shape having a roughly rectangular shape. A width in the upper and lower direction of the coil attaching part 35a (in other words, a width in a short widthwise direction of the coil attaching part 35a formed in a band shape) is set to be narrower than a width in the upper and lower direction of the sheet-shaped coil 34. Further, the coil attaching part 35a is structured of a first attaching part 35c to which the sheet-shaped coil 34A is attached, a second attaching part 35d to which the sheet-shaped coil 34B is attached, a third attaching part 35e to which the sheet-shaped coil 34C is attached, and a fourth attaching part 35f to which the sheet-shaped coil 34D is attached.

An end of the first attaching part 35c in a longitudinal direction of the coil attaching part 35a is connected with an end of the second attaching part 35d and the other end of the first attaching part 35c is connected with an end of the fourth attaching part 35f. The other end of the second attaching part 35d in a longitudinal direction of the coil attaching part 35a is connected with an end of the third attaching part 35e. The coil attaching part 35a is bent at a substantially right angle at three positions, i.e., a boundary between the first attaching part 35c and the second attaching part 35d, a boundary between the first attaching part 35c and the fourth attaching part 35f, and a boundary between the second attaching part 35d and the third attaching part 35e and, in this manner, the coil attaching part 35a is bent in a substantially rectangular tube shape so as to be along an inner peripheral face of the tube part 25b.

In the first attaching part 35c, the second attaching part 35d, the third attaching part 35e and the fourth attaching part 35f, recessed parts 35g as a circuit board side recessed part are formed at positions corresponding to the recessed part 34a of the sheet-shaped coil 34. The recessed parts 35g are formed on lower end sides of the first attaching part 35c, the second attaching part 35d, the third attaching part 35e and the fourth attaching part 35f. Further, the recessed part 35g is formed so as to be recessed to an upper side and is formed in a substantially rectangular shape.

The first attaching part 35c, the second attaching part 35d, the third attaching part 35e and the fourth attaching part 35f are formed with protruded parts 35h in a substantially rectangular shape which are protruded to an upper side. In the first attaching part 35c, the protruded part 35h is formed on a front end side of the first attaching part 35c and, in the second attaching part 35d, the protruded part 35h is formed on a left end side of the second attaching part 35d and, in the third attaching part 35e, the protruded part 35h is formed on a rear end side of the third attaching part 35e and, in the fourth attaching part 35f, the protruded part 35h is formed on a right end side of the fourth attaching part 35f. The protruded part 35h is formed with a solder land to which the solder land 43 of the sheet-shaped coil 34 is to be soldered and fixed, and the solder land 43 is soldered and fixed to the protruded part 35h. In this embodiment, a width in the upper and lower direction of a portion of the coil attaching part 35a where the protruded part 35h is formed is set to be narrower than a width in the upper and lower direction of the sheet-shaped coil 34.

The protruded part 35h formed in the third attaching part 35e is formed with a through-hole 35j in a circular shape. Further, a through-hole 35k in an elliptical shape is formed on an upper side with respect to the recessed part 35g of the fourth attaching part 35f. A portion of the fourth attaching part 35f where the through-hole 35k is formed is protruded toward an upper side.

The external connection part 35b is formed in a band shape. The external connection part 35b is connected with a lower end on a front end side of the first attaching part 35c and is extended from the lower end on the front end side of the first attaching part 35c. In other words, the external connection part 35b is extended from a substantially center position in the longitudinal direction of the coil attaching part 35a in a state that the coil attaching part 35a bent in a substantially rectangular tube shape is developed. The external connection part 35b is connected with the FPC 21 as described above.

The sheet-shaped coil 34 is attached to the coil attaching part 35a so that its lower end side and the lower end side of the coil attaching part 35a are substantially coincided with each other. Further, the sheet-shaped coil 34 is attached to the coil attaching part 35a so that the recessed part 34a and the recessed part 35g are overlapped with each other in the front and rear direction or the right and left direction. In a state that the sheet-shaped coil 34 is attached to the coil attaching part 35a, inner side faces of the protruded parts 35h in the front and rear direction or the right and left direction are contacted with upper end sides of outer side faces of the sheet-shaped coils 34 in the front and rear direction or the right and left direction. Further, in the state that the sheet-shaped coil 34 is attached to the coil attaching part 35a, the protruded parts 34b through 34d are slightly protruded to a lower side with respect to a lower end of the coil attaching part 35a.

Four sheet-shaped coils 34 are attached to an inner peripheral face of the coil attaching part 35a bent in a substantially rectangular tube shape in a separated state from each other with a predetermined gap space therebetween in a longitudinal direction of the coil attaching part 35a. In this embodiment, a boundary between the first attaching part 35c and the second attaching part 35d is located in a gap space portion between the sheet-shaped coil 34A and the sheet-shaped coil 34B, a boundary between the first attaching part 35c and the fourth attaching part 35f is located in a gap space portion between the sheet-shaped coil 34A and the sheet-shaped coil 34D, and a boundary between the second attaching part 35d and the third attaching part 35e is located in a gap space portion between the sheet-shaped coil 34B and the sheet-shaped coil 34C. The coil attaching part 35a is formed in a substantially rectangular tube shape by bending at a substantially right angle at three positions, i.e., a gap space portion between the sheet-shaped coil 34A and the sheet-shaped coil 34B, a gap space portion between the sheet-shaped coil 34A and the sheet-shaped coil 34D, and a gap space portion between the sheet-shaped coil 34B and the sheet-shaped coil 34C.

In this embodiment, in order to attach the sheet-shaped coils 34 to the coil attaching part 35a, the coil attaching part 35a and the sheet-shaped coils 34 are fixed to a predetermined jig. The through-holes 35j and 35k formed in the coil attaching part 35a are used for determining the position of the coil attaching part 35a with respect to the jig. Further, the recessed parts 34a of the sheet-shaped coils 34 and the recessed parts 35g of the coil attaching part 35a are used for aligning the sheet-shaped coils 34 with the coil attaching part 35a.

An outer peripheral face of the coil attaching part 35a which is bent in a substantially rectangular tube shape so as to be along an inner peripheral face of the tube part 25b is attached to the inner peripheral face of the tube part 25b. As described above, the width in the upper and lower direction of the coil attaching part 35a is set to be narrower than the width in the upper and lower direction of the sheet-shaped coil 34. Further, the sheet-shaped coils 34 are attached to the coil attaching part 35a so that their lower end sides are substantially coincided with the lower end side of the coil attaching part 35a. Therefore, as shown in FIG. 2, a gap space "S" corresponding to the thickness of the coil attaching part 35a is formed between an upper end side of the sheet-shaped coil 34 and the inner peripheral faces of the tube part 25b. In this embodiment, the sheet-shaped coil 34 and the coil attaching part 35a are fixed to the inner peripheral face of the tube part 25b by an adhesive and the gap space "S" is utilized as an adhesive reservoir where the adhesive for fixing the sheet-shaped coils 34 and the coil attaching part 35a to the inner peripheral face of the tube part 25b is retained.

When the coil attaching part 35a in a state that the sheet-shaped coils 34 have been attached is to be attached to the inner peripheral face of the tube part 25b, first, an adhesive is applied to the inner peripheral face of the tube part 25b. Further, the coil attaching part 35a is bent in a substantially rectangular tube shape at three positions, i.e., the boundary between the first attaching part 35c and the second attaching part 35d, the boundary between the first attaching part 35c and the fourth attaching part 35f, and the boundary between the second attaching part 35d and the third attaching part 35e. In this case, in order to smoothly insert the coil attaching part 35a into the inner peripheral side with respect to the tube part 25b, the coil attaching part 35a is bent in a substantially rectangular tube shape so that an outward form of the coil attaching part 35a becomes smaller than the inner peripheral face of the tube part 25b. After that, the coil attaching part 35a is inserted from the lower end side of the tube part 25b into the inner peripheral side of the tube part 25b and then the coil attaching part 35a is fixed to the inner peripheral face of the tube part 25b.

(Principal Effects in this Embodiment)

As described above, in this embodiment, the coil attaching part 35a which is fixed to the inner peripheral face of the tube part 25b of the case body 25 is bent at a substantially right angle at three positions, i.e., the gap space portion between the sheet-shaped coil 34A and the sheet-shaped coil 34B, the gap space portion between the sheet-shaped coil 34A and the sheet-shaped coil 34D, and the gap space portion between the sheet-shaped coil 34B and the sheet-shaped coil 34C and thereby the coil attaching part 35a is formed in a substantially rectangular tube shape. Further, in this embodiment, the thickness of the coil attaching part 35a is thinner than the thickness of the sheet-shaped coil 34. In other words, in this embodiment, the coil attaching part 35a is bent at portions which are thinner than the sheet-shaped coil 34. Therefore, in this embodiment, the shape of the coil attaching part 35a bent in a substantially rectangular tube shape is easily stabilized and the coil attaching part 35a bent in a substantially rectangular tube shape is easily handled. Accordingly, in this embodiment, attaching work of the sheet-shaped coils 34 and the coil attaching part 35a to the tube part 25b can be performed easily.

Further, in this embodiment, the thickness of the coil attaching part 35a is thinner than the thickness of the sheet-shaped coil 34 and thus, even when the coil attaching part 35a is bent in a substantially rectangular tube shape, cracking is hard to be occurred in bent parts of the coil attaching part 35a. Therefore, in this embodiment, deterioration in quality of an image photographed by the optical device 1 is hard to be occurred by a foreign matter generated due to cracking of the coil attaching part 35a.

In this embodiment, the gap space "S" having a width of the thickness of the coil attaching part 35a is formed between an upper end side of the sheet-shaped coil 34 and an inner peripheral face of the tube part 25b and the gap space "S" is utilized as an adhesive reservoir for retaining adhesive for fixing the sheet-shaped coils 34 and the coil attaching part 35a to the inner peripheral face of the tube part 25b. Therefore, in this embodiment, attaching strength of the sheet-shaped coils 34 and the coil attaching part 35a to the tube part 25b can be increased.

Further, in this embodiment, the sheet-shaped coils 34 are attached to the coil attaching part 35a so that the gap space "S" is formed between an upper end side of the sheet-shaped coil 34 and the inner peripheral faces of the tube part 25b. Therefore, in a case that, after an adhesive is applied to the inner peripheral face of the tube part 25b, the coil attaching part 35a is inserted into the inner peripheral side of the tube part 25b from the lower end side of the tube part 25b and the coil attaching part 35a is fixed to the inner peripheral face of the tube part 25b, a problem can be prevented that the adhesive applied to the inner peripheral face of the tube part 25b is scraped by the coil attaching part 35a and pushed out toward the bottom part 25a side. Accordingly, in this embodiment, a trouble such that the adhesive applied to the inner peripheral face of the tube part 25b is adhered to other members or a jig can be prevented.

In this embodiment, the protruded parts 35h protruding to an upper side are formed in the coil attaching part 35a and the inner side faces of the protruded parts 35h in the front and rear direction or the right and left direction are contacted with upper end sides of the outer side faces of the sheet-shaped coils 34 in the front and rear direction or the right and left direction. Therefore, in this embodiment, inclination (slanting) with respect to the "Z-X" plane or the "Y-Z" plane of the sheet-shaped coil 34 which is disposed substantially parallel to the "Z-X" plane or the "Y-Z" plane can be suppressed by the protruded part 35h. Especially, in this embodiment, a solder land to which the solder land 43 of the sheet-shaped coil 34 is to be soldered and fixed is formed in the protruded part 35h and the solder land 43 is soldered and fixed to the protruded part 35h. Therefore, inclination of the sheet-shaped coil 34 can be suppressed effectively with respect to the "Z-X" plane or the "Y-Z" plane. Accordingly, in this embodiment, a gap space between the drive magnet 38 and the coil part 33 can be maintained appropriately. Further, a gap space "S" having a width of the thickness of the coil attaching part 35a can be formed appropriately between the upper end side of the sheet-shaped coil 34 and the inner peripheral face of the tube part 25b.

In this embodiment, in addition to the solder lands 41 and 42 for supplying electric power to the coil parts 33, the solder land 43 is soldered and fixed to the solder land formed in the coil attaching part 35a. Therefore, in this embodiment, fixed strength of the sheet-shaped coil 34 to the coil attaching part 35a can be increased.

In this embodiment, the external connection part 35*b* is extended from a substantially center position in the longitudinal direction of the coil attaching part 35*a* in a state that the coil attaching part 35*a* bent in a substantially rectangular tube shape is developed. Therefore, in this embodiment, a plurality of wiring patterns connected with four coil parts 33 are diverged toward respective both end parts of the coil attaching part 35*a* from a connected portion of the external connection part 35*b* with the coil attaching part 35*a*. Accordingly, in this embodiment, the number of wiring patterns arranged in the upper and lower direction can be reduced in the coil attaching part 35*a* and, as a result, the width of the coil attaching part 35*a* in the upper and lower direction can be made narrow.

In this embodiment, the protruded parts 34*b* through 34*d* which are protruded toward a lower side are formed in the sheet-shaped coil 34. Therefore, in this embodiment, even when the holding side fixed part of the plate spring 6 is fixed to the upper end of the side face part 26*b* of the lower case body 26 by welding on a lower side with respect to the sheet-shaped coil 34, a distance between a welded portion of the holding side fixed part to the side face part 26*b* and the main body portion of the sheet-shaped coil 34 can be secured by utilizing the protruded parts 34*b* through 34*d*. Accordingly, in this embodiment, in a case that the holding side fixed part is to be welded to the side face part 26*b*, even when sparks are scattered to the main body portion of the sheet-shaped coil 34, the main body portion of the sheet-shaped coil 34 is prevented from being damaged. Further, in this embodiment, a short circuit between the soldered portion of the sheet-shaped coil 34 to the coil attaching part 35*a* and the welded portion of the holding side fixed part to the side face part 26*b* can be prevented from being formed.

In this embodiment, the recessed part 34*a* is formed in the sheet-shaped coil 34 and the recessed part 35*g* is formed in the coil attaching part 35*a*. Further, in this embodiment, the recessed part 34*a* and the recessed part 35*g* are used for aligning the sheet-shaped coil 34 with the coil attaching part 35*a*. Therefore, in this embodiment, when the sheet-shaped coil 34 is to be attached to the coil attaching part 35*a*, the sheet-shaped coil 34 is easily aligned with the coil attaching part 35*a*.

OTHER EMBODIMENTS

Although the present invention has been shown and described with reference to a specific embodiment, various changes and modifications will be apparent to those skilled in the art from the teachings herein.

In the embodiment described above, the drive magnets 38 are attached to an outer peripheral side of the movable module 4 and the sheet-shaped coils 34 and the FPC 35 are attached to an inner peripheral face of the tube part 25*b* of the case body 25. However, the present invention is not limited to this embodiment. For example, it may be structured that the drive magnets 38 are attached to an inner peripheral face of the tube part 25*b* and the sheet-shaped coils 34 and the coil attaching part 35*a* are attached to an outer peripheral side of the movable module 4. In this case, for example, the movable module 4 includes a cover member having a substantially rectangular tube shape which structures side faces in the front and rear direction and the right and left direction of the movable module 4. The sheet-shaped coils 34 are attached to an outer peripheral face of the coil attaching part 35*a*, which is bent in a substantially rectangular tube shape so as to be along an outer peripheral face of the cover member, and an inner peripheral face of the coil attaching part 35*a* bent in a substantially rectangular tube shape is attached to the outer peripheral face of the cover member. Also in this case, similar effects to the embodiment described above can be obtained.

In the embodiment described above, four sheet-shaped coils 34 each of which is provided with one coil part 33 is attached to the coil attaching part 35*a*. However, the present invention is not limited to this embodiment. For example, two sheet-shaped coils each of which is provided with two coil parts 33 may be attached to the coil attaching part 35*a*. In this case, two sheet-shaped coils are attached to the coil attaching part 35*a* with a predetermined gap space therebetween in a longitudinal direction of the coil attaching part 35*a*. Further, in this case, the coil attaching part 35*a* is bent at a substantially right angle in a gap space portion between two sheet-shaped coils, and the sheet-shaped coil and the coil attaching part 35*a* are bent at a substantially right angle in a predetermined portion between two coil parts 33 of one sheet-shaped coil and thereby the coil attaching part 35*a* to which the sheet-shaped coils are attached is formed in a substantially rectangular tube shape. Also in this case, in comparison with the optical unit described in the above-mentioned Patent Literature 1, attaching work of the sheet-shaped coils to the tube part 25*b* of the case body 25 is easy and, in addition, attaching strength of the sheet-shaped coils to the tube part 25*b* can be increased.

In the embodiment described above, the sheet-shaped coil 34 is attached to the coil attaching part 35*a* so that its lower end side is substantially coincided with the lower end side of the coil attaching part 35*a*. However, the present invention is not limited to this embodiment. For example, the sheet-shaped coil 34 may be attached to the coil attaching part 35*a* so that the coil attaching part 35*a* is disposed at its center position in the upper and lower direction. In this case, in addition to the protruded part 35*h* or instead of providing the protruded part 35*h*, a protruded part protruding to a lower side from the coil attaching part 35*a* may be formed in the coil attaching part 35*a*.

In the embodiment described above, one solder land 43 is formed in the sheet-shaped coil 34 for increasing fixed strength of the sheet-shaped coil 34 to the coil attaching part 35*a*. However, the present invention is not limited to this embodiment. For example, two or more solder lands may be formed in the sheet-shaped coil 34 for increasing fixed strength of the sheet-shaped coil 34 to the coil attaching part 35*a*. Further, in a case that fixed strength of the sheet-shaped coil 34 to the coil attaching part 35*a* is secured, no solder land 43 may be formed in the sheet-shaped coil 34.

In the embodiment described above, the solder lands 41 and 42 are formed on a lower end side of the sheet-shaped coil 34. However, the present invention is not limited to this embodiment. For example, one of the solder lands 41 and 42 is formed on a lower end side of the sheet-shaped coil 34 and the other of the solder lands 41 and 42 may be formed on an upper end side of the sheet-shaped coil 34. In this case, the solder land 43 may be formed on an upper end side of the sheet-shaped coil 34, may be formed on a lower side of the sheet-shaped coil 34, or may be formed at a substantially center position in the upper and lower direction of the sheet-shaped coil 34. Further, in this case, the solder lands 41 and 42 may be formed at the same position as each other in the front and rear direction or the right and left direction or may be formed at positions displaced from each other in the front and rear direction or the right and left direction. When the solder lands 41 and 42 are formed at the same position as each other in the front and rear direction or the right and left direction, the solder land 43 is formed at a position displaced from the solder lands 41 and 42 in the front and rear direction or the right and left direction. Further, when the solder lands 41 and 42 are formed at positions displaced from each other in the front and rear direction or the right and left direction, the solder land 43 may be formed at the same position as the solder land 41 or the solder land 42 in the front and rear direction or the right and left direction, or may be formed at a position displaced from the solder lands 41 and 42 in the front and rear direction or the right and left direction.

In the embodiment described above, the optical device 1 is formed in a substantially square shape when viewed in the optical axis direction. However, the optical device 1 may be formed in a substantially rectangular shape when viewed in the optical axis direction. Further, the optical device 1 may be formed in other polygonal shapes when viewed in the optical axis direction. In this case, the tube part 25*b* of the case body 25 is formed in a multi-angular tube shape depending on the shape of the optical device 1. Further, a plurality of sheet-shaped coils 34 depending on the shape of the tube part 25*b* is attached to a coil attaching part 35*a*. The coil attaching part 35*a* to which a plurality of the sheet-shaped coils 34 is attached is bent in a multi-angular tube shape so as to be along an inner peripheral face of the tube part 25*b*. Further, the optical device 1 may be formed in a circular shape or an elliptic shape when viewed in the optical axis direction.

In the embodiment described above, the lens drive mechanism 30 is a so-called voice coil motor which includes the lens drive coils 32 and the drive magnets 38. However, the present invention is not limited to this embodiment. For example, the lens drive mechanism 30 may include a piezoelectric element or a shape-memory alloy for moving a lens in an optical axis direction. Further, in the embodiment described above, the optical device 1 is provided with an autofocus function but the optical device 1 may be provided with no autofocus function. In other words, the optical device 1 may include no lens drive mechanism 30.

In the embodiment described above, as an example, an embodiment of the present invention is the optical device 1 in which the movable module 4 is a movable part and the support body 5 is a holding part. However, the structure of at least an embodiment of the present invention may be applied to an optical device other than the optical device 1. For example, the structure of at least an embodiment of the present invention may be applied to the movable module 4 in which the movable body 8 is a movable part, the holding body 9 movably holding the movable body 8 in the optical axis direction is a holding part, and the lens drive mechanism 30 for driving the movable body 8 in the optical axis direction is a drive mechanism.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

The invention claimed is:

1. An optical device comprising:
a movable part comprising a lens for photographing;
a holding part structured to movably hold the movable part; and
a drive mechanism structured to drive the movable part;
wherein the holding part comprises a case body which covers an outer peripheral side of the movable part;
wherein the drive mechanism comprises:
a plurality of drive magnets which are attached to an outer peripheral side of the movable part;
a plurality of sheet-shaped coils integrally comprising a coil part which are oppositely disposed to the drive magnets; and
a flexible printed circuit board comprising a coil attaching part in a band shape extended in a longitudinal direction perpendicular to an optical axis direction of the lens, an outer side face of the coil attaching part being attached to an inner peripheral side of the case body so as to surround the movable part;
wherein each of the plurality of the sheet-shaped coils is attached to an inner side face of the coil attaching part so that the plurality of the sheet-shaped coils are respectively separated from each other in the longitudinal direction of the coil attaching part;
wherein a thickness of the coil attaching part is thinner than a thickness of each of the plurality of the sheet-shaped coils and the coil attaching part is bent at positions between the sheet-shaped coils so as to be along the inner peripheral side of the case body;
wherein a width of the coil attaching part in a short widthwise direction of the coil attaching part which is parallel to the optical axis direction of the lens is narrower than a width of the sheet-shaped coil in the short widthwise direction of the coil attaching part, and the sheet-shaped coils and the coil attaching part are adhesively fixed to the inner peripheral side of the case body in a state that a gap space between the inner peripheral side of the case body and the sheet-shaped coil is utilized as an adhesive reservoir for retaining an adhesive for fixing the sheet-shaped coils and the coil attaching part to the inner peripheral side of the case body;
each of the sheet-shaped coils comprises two first solder lands for supplying electric power to the coil part and a second solder land which is disposed at a position displaced from the first solder lands at least in one of the longitudinal direction of the coil attaching part and the short widthwise direction of the coil attaching part, and
the first solder lands and the second solder land are soldered and fixed to the coil attaching part.

2. The optical device according to claim 1, wherein the drive mechanism comprises four sheet-shaped coils, the case body comprises a tube part which is formed in a substantially rectangular tube shape and the coil attaching part is fixed to the tube part, and
the coil attaching part is attached to the inner peripheral face of the tube part and the coil attaching part is formed in a substantially rectangular tube shape.

3. The optical device according to claim 2, wherein the coil attaching part comprises a protruded part which is protruded in the short widthwise direction of the coil attaching part so as to contact with a part of the sheet-shaped coil.

4. The optical device according to claim 1, wherein the flexible printed circuit board comprises an external connection part in a band shape for electrically connecting the coil part with an outside, and the external connection part is extended from a substantially center position in the longitudinal direction of the coil attaching part in a state that the coil attaching part is developed.

5. The optical device according to claim 1, further comprising a plate spring comprising a movable side fixed part which is fixed to the movable part, a holding side fixed part which is fixed to the holding part, and a spring part which connects the movable side fixed part with the holding side fixed part,
   wherein when one side in the optical axis direction of the lens is an object side and the other side in the optical axis direction of the lens is an anti-object side, the holding side fixed part is welded and fixed to the holding part on the anti-object side with respect to the sheet-shaped coil, and
   wherein the sheet-shaped coil comprises a protruded part which protrudes toward the anti-object side.

6. The optical device according to claim 1, wherein
   each of the sheet-shaped coils comprises a coil side recessed part which is recessed in the short widthwise direction of the coil attaching part, and
   the coil attaching part comprises a circuit board side recessed part which is recessed in the short widthwise direction of the coil attaching part at a position corresponding to the coil side recessed part.

7. The optical device according to claim 1, wherein the coil attaching part comprises a through-hole for positioning the coil attaching part with respect to a jig to which the coil attaching part is fixed when the sheet-shaped coil is to be attached to the coil attaching part.

\* \* \* \* \*